(12) United States Patent
Gupta et al.

(10) Patent No.: US 7,292,670 B2
(45) Date of Patent: Nov. 6, 2007

(54) SYSTEM AND METHOD FOR AUTOMATICALLY CORRECTING DUTY CYCLE DISTORTION

(75) Inventors: Atul K. Gupta, Mississauga (CA); Wesley C. d'Haene, Burlington (CA)

(73) Assignee: Gennum Corporation (CA)

( * ) Notice: Subject to any disclaimer, the term of this patent is extended or adjusted under 35 U.S.C. 154(b) by 810 days.

(21) Appl. No.: 10/635,309

(22) Filed: Aug. 6, 2003

(65) Prior Publication Data

US 2005/0031065 A1 Feb. 10, 2005

(51) Int. Cl.
*H04L 7/00* (2006.01)
*H04L 25/00* (2006.01)
*H04L 25/40* (2006.01)

(52) U.S. Cl. .................. 375/371; 375/326; 375/354; 375/355; 375/376

(58) Field of Classification Search .............. 375/354, 375/355, 371, 376, 326
See application file for complete search history.

(56) References Cited

U.S. PATENT DOCUMENTS

| | | |
|---|---|---|
| 4,270,183 A | 5/1981 | Robinson et al. |
| 4,805,198 A | 2/1989 | Stern et al. |
| 5,077,529 A | 12/1991 | Ghoshal et al. |
| 5,142,555 A | 8/1992 | Whiteside |
| 5,150,386 A | 9/1992 | Stern et al. |
| 5,329,559 A | 7/1994 | Wong et al. |
| 5,349,612 A | 9/1994 | Guo et al. |
| 5,400,370 A | 3/1995 | Guo |
| 5,459,753 A | 10/1995 | Co et al. |
| 5,515,403 A | 5/1996 | Sloan et al. |
| 5,533,072 A | 7/1996 | Georgiou et al. |
| 5,568,526 A | 10/1996 | Ferraiolo et al. |

(Continued)

OTHER PUBLICATIONS

MAXIM application note 1130: Phase-lock Loop Applications Using the MAX9382, Jun. 26, 2002.*

(Continued)

*Primary Examiner*—Dac Ha
*Assistant Examiner*—Ted M. Wang
(74) *Attorney, Agent, or Firm*—Jones Day (57) ABSTRACT

In accordance with the teachings described herein, systems and methods are provided for automatically correcting duty cycle distortion. A slicer may be used to receive a data input signal and compare the data input signal with a slicer offset voltage to generate a sliced data signal. The slicer may also receive an offset control signal to automatically adjust the slicer offset voltage. A phase detector may be used to receive the sliced data signal and a recovered clock signal and to compare the sliced data signal with the recovered clock signal to generate a rising edge output signal and a falling edge output signal. The rising edge output signal may correspond to a phase difference between a rising edge of the sliced data signal and an edge of the recovered clock signal. The falling edge output signal may correspond to a phase difference between a falling edge of the sliced data signal and an edge of the recovered clock signal. A first feedback circuit may be used to phase-lock the recovered clock signal to the sliced data signal utilizing at least one of the rising edge output signal and the falling edge output signal. At least one of the rising edge output signal and the falling edge output signal may be configured in a second feedback circuit to generate the offset control signal.

28 Claims, 6 Drawing Sheets

U.S. PATENT DOCUMENTS

| | | | |
|---|---|---|---|
| 5,587,709 | A | 12/1996 | Jeong |
| 5,610,952 | A | 3/1997 | Yamanaka et al. |
| 5,619,541 | A | 4/1997 | Van Brunt et al. |
| 5,640,523 | A | 6/1997 | Williams |
| 5,644,605 | A | 7/1997 | Whiteside |
| 5,712,580 | A | 1/1998 | Baumgartner et al. |
| 5,712,884 | A | 1/1998 | Jeong |
| 5,764,709 | A | 6/1998 | Whiteside |
| 5,832,047 | A | 11/1998 | Ferraiolo et al. |
| 6,088,415 | A | 7/2000 | Guadet |
| 6,101,197 | A | 8/2000 | Keeth et al. |
| 6,192,092 | B1 | 2/2001 | Dizon et al. |
| 6,205,191 | B1 | 3/2001 | Portmann et al. |
| 6,236,696 | B1 | 5/2001 | Aoki et al. |
| 6,285,726 | B1 | 9/2001 | Gaudet |
| 6,304,623 | B1 | 10/2001 | Richards et al. |
| 6,516,006 | B1 | 2/2003 | Walker et al. |
| 6,526,109 | B1 | 2/2003 | Chang et al. |
| 7,136,441 | B2 * | 11/2006 | Iwata et al. ............... 375/355 |
| 2003/0102928 | A1 | 6/2003 | d'Haene et al. |
| 2003/0165207 | A1 * | 9/2003 | Noguchi et al. ........... 375/371 |
| 2004/0161070 | A1 * | 8/2004 | Yin et al. ................. 375/371 |

OTHER PUBLICATIONS

Franceschino et al., "An IF communication Circuit Tutorial", Motorola Inc. 1996, Publication # AN1539, pp. 1-8.

Redd, Justin, "Synch and Clock Recovery—An Analog Guru Looks at Jitter", Maxim Integrated Products, Sunnyvale, California, Aug. 27, 2001, pp. 1-10.

* cited by examiner

SYSTEM AND METHOD FOR AUTOMATICALLY CORRECTING DUTY CYCLE DISTORTION

FIELD

The technology described in this patent document relates generally to circuits for correcting duty cycle distortion in a signal. More particularly, the patent document describes a system and method for automatically correcting duty cycle distortion that is particularly well-suited for use in high-speed, high-performance clock and data recovery circuits.

BACKGROUND AND SUMMARY

Duty cycle distortion is a common problem in many optical driver and receiver circuits, as well as in other types of circuits. Duty cycle distortion in an optical driver or receiver circuit may, for instance, be the result of asymmetrical rise and fall times in a typical optical data signal.

In accordance with the teachings described herein, systems and methods are provided for automatically correcting duty cycle distortion. A slicer may be used to receive a data input signal and compare the data input signal with a slicer offset voltage to generate a sliced data signal. The slicer may also receive an offset control signal to automatically adjust the slicer offset voltage. A phase detector may be used to receive the sliced data signal and a recovered clock signal and to compare the sliced data signal with the recovered clock signal to generate a rising edge output signal and a falling edge output signal. The rising edge output signal may correspond to a phase difference between a rising edge of the sliced data signal and an edge of the recovered clock signal. The falling edge output signal may correspond to a phase difference between a falling edge of the sliced data signal and an edge of the recovered clock signal. A first feedback circuit may be used to phase-lock the recovered clock signal to the sliced data signal utilizing at least one of the rising edge output signal and the falling edge output signal. At least one of the rising edge output signal and the falling edge output signal may be configured in a second feedback circuit to generate the offset control signal.

DETAILED DESCRIPTION

Figure 1:
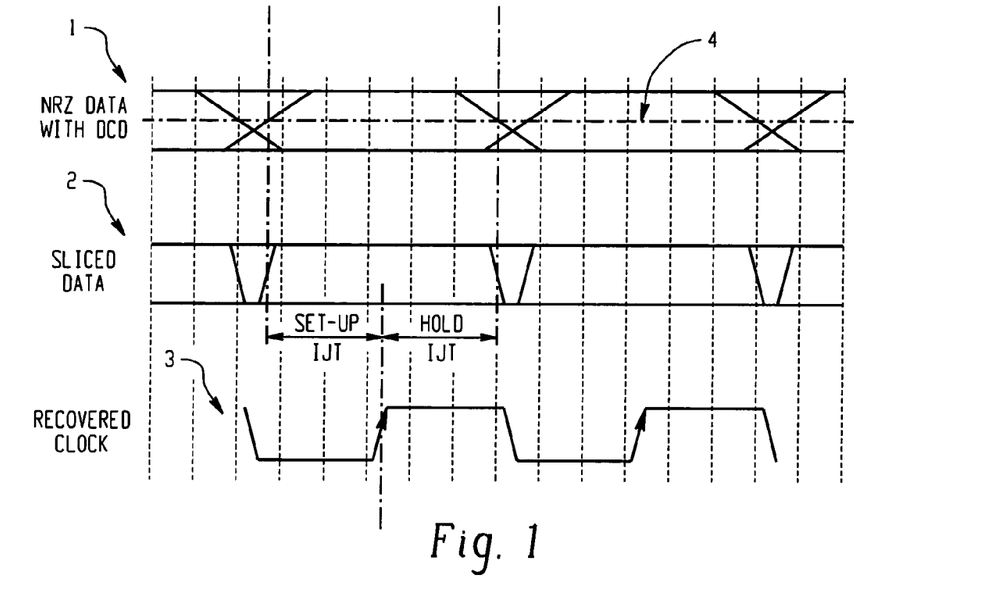
FIGS. 1 and 2 are timing diagrams illustrating a typical method for correcting duty cycle distortion in a clock and data recovery system.
Figure 2:
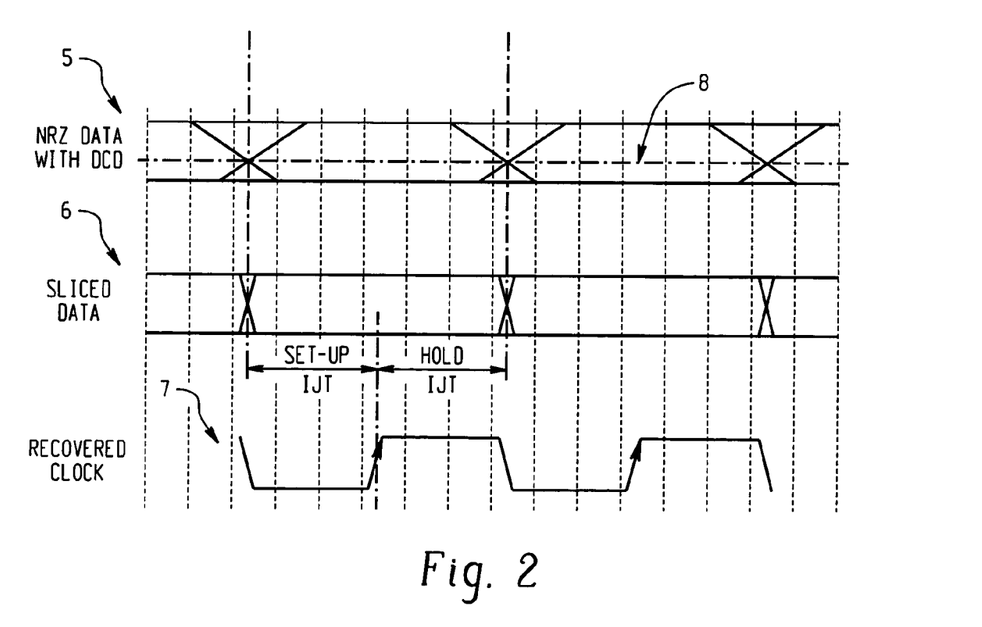

With reference now to the drawing figures, FIGS. 1 and 2 are timing diagrams illustrating a method for correcting duty cycle distortion in a clock and data recovery system. FIGS. 1 and 2 both illustrate an eye pattern for a typical data input signal 1, 5 received by a clock and data recovery system. Also shown are a sliced data input signal 2, 6 and a recovered clock signal 3, 7. In a typical clock and data recovery circuit, a slicer (e.g., a limiting amplifier) may be used to horizontally slice the data input signal 1, 5 at a pre-selected slicer offset voltage 4, 8. A recovered clock signal 3, 7 is then typically aligned in order to sample the resulting sliced data signal 2, 6. (See, e.g., FIG. 3-5)

FIG. 1 illustrates a typical default setting for the slicer offset voltage 4. For example, in the case of a differential AC coupled data input signal 1, the default slicer offset voltage 4 will typically be at a zero potential. However, as a result of duty cycle distortion in the data input signal 1, the default slicer offset voltage 4 may not align with the crossing-point in the eye pattern of the data input signal 1. If not corrected, the duty cycle distortion may reduce the input jitter tolerance (IJT) of the clock and data recovery circuit as a result of the sliced data signal 2, as illustrated.

FIG. 2 illustrates that duty cycle distortion in the input data signal 5 may be corrected by adjusting the slicer offset voltage 8 to correspond with the crossing-point in the eye pattern of the data input signal 5. Example circuits for automatically adjusting the slicer offset voltage 8 to correct duty cycle distortion in a data input signal 5 are described below with reference to FIGS. 3-11.

Figure 3:
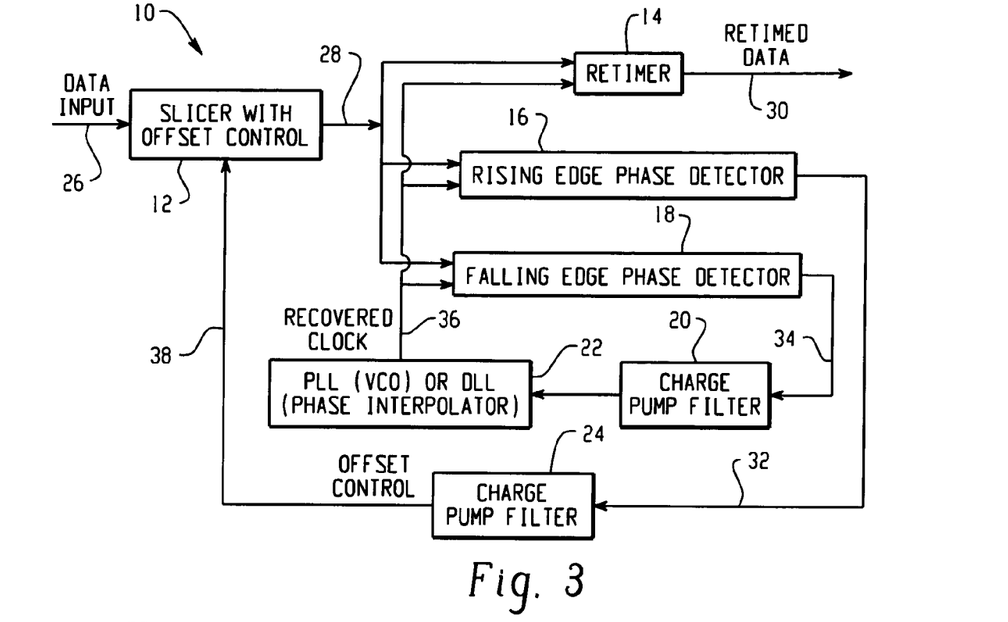
FIG. 3 is a block diagram of an example clock and data recovery system that automatically corrects duty cycle distortion in a data input signal.

FIG. 3 is a block diagram of an example clock and data recovery system 10 that automatically corrects duty cycle distortion in a data input signal 26. The system 10 includes a slicer 12, a phase detector circuit 14, 16, 18, a first feedback circuit 20, 22, and a second feedback circuit 24. The phase detector circuit includes a retimer 14, a rising edge phase detector 16 and a falling edge phase detector 18. The first feedback circuit includes a charge pump filter 20 and a phase-locking circuit 22. The second feedback circuit includes a charge pump filter 24.

The slicer 12 is operable to receive the data input signal 26 and compare the data input signal 26 with a slicer offset voltage to generate a sliced data signal 28. The slicer offset voltage is automatically adjusted by an offset control signal 38 received by the slicer 12 from the second feedback circuit 24.

The phase detector circuit 14, 16, 18 is operable to receive the sliced data signal 28 from the slicer 12 and a recovered clock signal 36 from the first feedback circuit 20, 22 to generate a rising edge output signal 32, a falling edge output signal 34, and a retimed data signal 30. More specifically, the rising edge phase detector 16 generates the rising edge output signal 32 to correspond with the phase difference between the rising edge of the sliced data signal 28 and an edge of the recovered clock signal 36. Similarly, the falling edge phase detector 18 generates the falling edge output signal 34 to correspond with the phase difference between the falling edge of the sliced data signal 28 and an edge of the recovered clock signal 36. The retimer circuit 14 synchronizes the sliced data signal 28 with the recovered clock signal 36 to generate the retimed data signal 30. An example phase detector circuit 14, 16, 18 is described below in more detail with reference to FIG. 6.

The first feedback circuit 20, 22 is operable to phase-lock the falling edge of the recovered clock signal 36 to the falling edges of the sliced data signal 28. The first feedback circuit 20, 22 may be configured as a phase-locked loop (PLL) circuit, a delay-locked loop (DLL) circuit, or some other type of phase-locking circuit. For example, if a PLL circuit is utilized, then the first feedback circuit may include a charge pump filter 20 and a voltage controlled oscillator (VCO) 22. The charge pump filter 20 may receive the falling edge output signal 34 and generate a charge pump output signal by integrating the falling edge output signal 34. The voltage-controlled oscillator 22 may receive the charge pump output signal from the charge pump filter 20 and generate the recovered clock signal 36 with a frequency that is a function of the charge pump output signal. In another example, if the first feedback circuit is configured as a delay-locked loop (DLL), then the circuit may include the charge pump filter 20, a phase interpolator 22, and a fixed frequency signal generator such as a crystal oscillator. The phase interpolator 22 may use the charge pump output signal from the charge pump filter 20 to control the phase of a reference clock signal from the crystal oscillator in order to generate the recovered clock signal 36. Alternatively, a voltage or current controlled delay circuit may be included in the delay-locked loop (DLL) in place of the phase interpolator 22.

The second feedback circuit 24 is operable to generate the offset control signal 38 as a function of the rising edge output signal 32. The second feedback circuit 24 may include a charge pump filter 24 that receives the rising edge output signal 32 and generates the offset control signal 38 with a polarity corresponding to the logic level of the integrated rising edge output signal 32. For example, if the rising edge output signal 32 is in a high logic state the majority of the time, then the charge pump filter 24 may generate a positive offset control signal 38, causing the slicer offset level to fall. Conversely, if the rising edge output signal 32 is at a low logic state the majority of the time, then the charge pump filter 24 may generate a negative offset control signal 38, causing the slicer offset level to rise.

Figure 4:
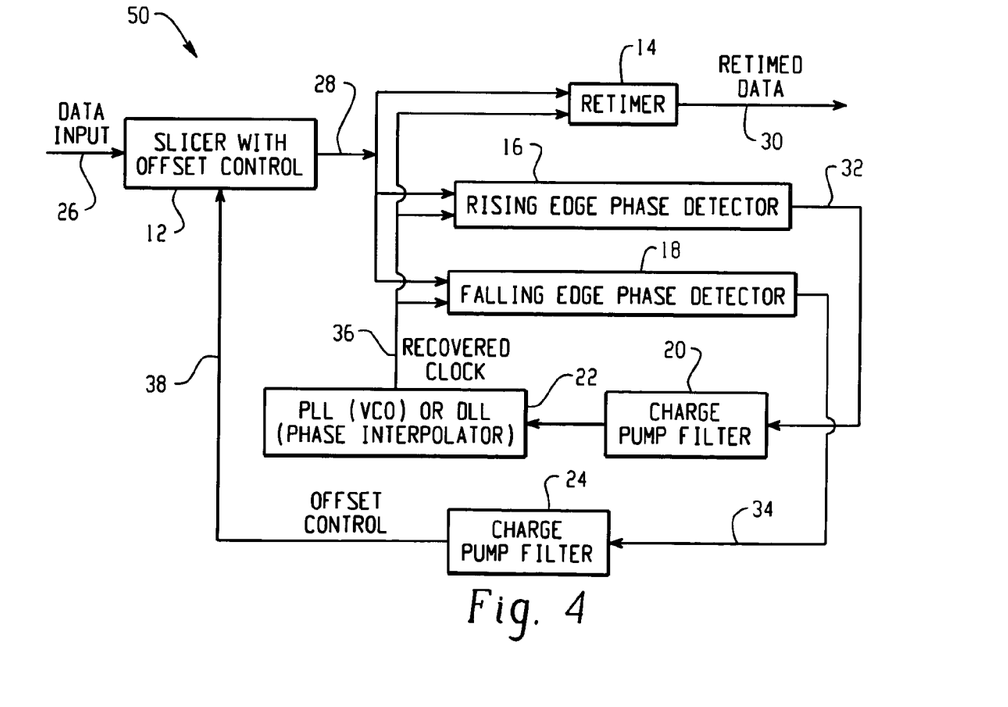
FIG. 4 is a block diagram of one alternative example clock and data recovery system that automatically corrects duty cycle distortion in a data input signal.

FIG. 4 is a block diagram of one alternative example clock and data recovery system 50 that automatically corrects duty cycle distortion in a data input signal 26. FIG. 4 is similar to the clock and data recovery system 10 of FIG. 3, except that in this system 50 the rising edge output signal 32 is configured in the first feedback circuit 20, 22 and the falling edge output signal 34 is configured in the second feedback circuit 24. That is, in FIG. 4 the first feedback circuit 20, 22 is operable to phase-lock the falling edge of the recovered clock signal 36 to the rising edges of the sliced data signal 28, and the second feedback circuit 24 is operable to generate the offset control signal 38 as a function of the falling edge output signal 34. Thus, in this example 50, the slicer offset level is automatically adjusted upwards when the falling edge output signal 34 is in a high logic state and is automatically adjusted downwards when the falling edge output signal 34 is in a low logic state.

Figure 5:
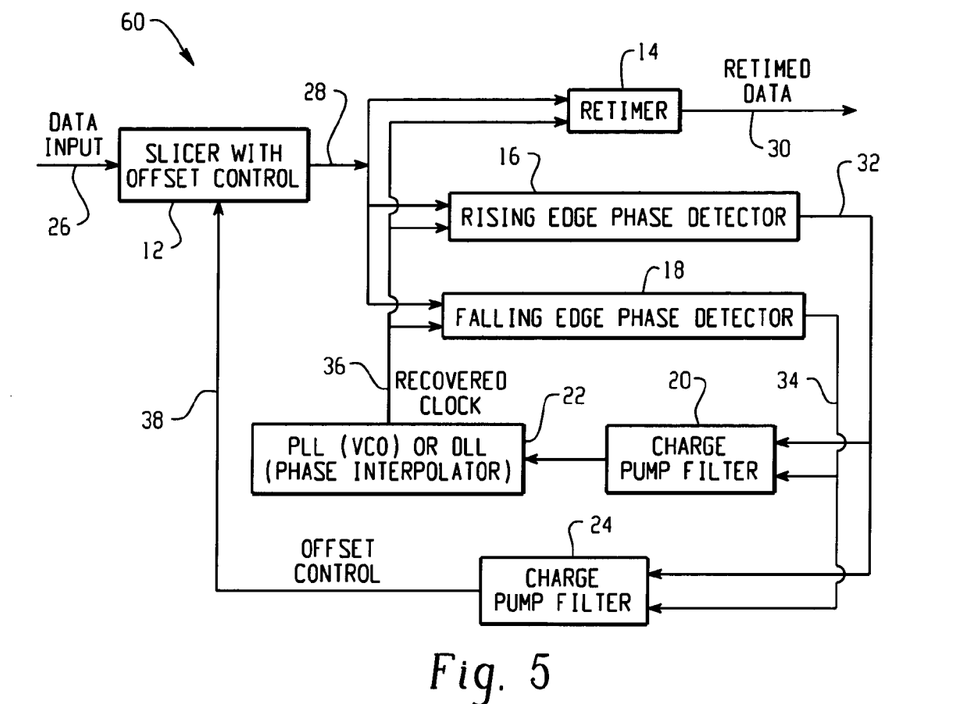
FIG. 5 is a block diagram of another alternative example clock and data recovery system that automatically corrects duty cycle distortion in a data input signal.

FIG. 5 is a block diagram of another alternative example clock and data recovery system 60 that automatically corrects duty cycle distortion in a data input signal 26. FIG. 5 is similar to the clock and data recovery systems 10, 50 shown in FIGS. 3 and 4, except that in this system 60 both the rising edge output signal 32 and the falling edge output signal 34 are configured in each of the first feedback circuit 20, 22 and the second feedback circuit 24. The charge pump filters 20, 24 in this embodiment 60 may be two-input charge pump filters that are configured to respond to both the rising edge output signal 32 and the falling edge output signal 34. For example, in the second feedback circuit, the charge pump 24 may be operable to adjust the slicer offset level upwards when either the rising edge output signal 32 is in a consistent low logic state, or the falling edge output signal 34 is in a consistent high logic state, and to adjust the slicer offset level downwards when either the rising edge output signal 32 is in a consistent high logic state, or the falling edge output signal 34 is in a consistent low logic state. Alternatively, the rising edge output signal 32 and the falling edge output signal 34 may be combined into a single feedback signal that is input to the charge pump filters 20, 24 in the first and/or second feedback circuit. For example, the rising edge output signal 32 and the falling edge output edge output signal 34 could be combined using a logic gate (e.g., an OR gate), a multiplexer (see, e.g., FIG. 9), by filtering and comparing the two signals 32, 34, or by some other suitable means.

Figure 6:
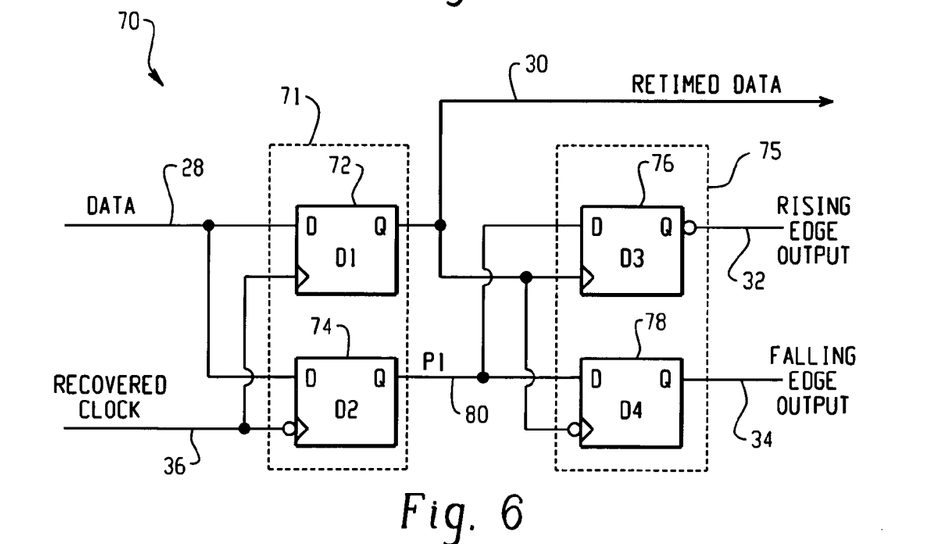
FIG. 6 is a block diagram of an example phase detector circuit for the clock and data recovery systems of FIGS. 3-5.

FIG. 6 is a block diagram of an example phase detector circuit 70, which may be used to implement the retimer 14, rising edge phase detector 16, and falling edge phase detector 18 in the clock and data recovery systems 10, 50, 60 of FIGS. 3-5. The example phase detector circuit 70 includes a retiming stage 71 and a synchronization stage 75. The retiming stage 71 includes a first retiming stage latch (D1) 72 and a second retiming stage latch (D2) 74, and the synchronization stage 75 includes a first synchronization state latch (D3) 76 and a second synchronization stage latch (D4) 78. The illustrated latches 72, 74, 76, 78 are D-type flip-flops. It should be understood, however, that other types of stage devices could also be used, such as J-type flip-flops, R-S flip-flops, shift registers, or other similar devices.

The retiming stage 71 is coupled to the sliced data signal 28 and the recovered clock signal 38, and samples the sliced data signal 28 on the rising and falling edges of the recovered clock signal 36 to generate the retimed data signal 30 and a synchronization signal (P1) 80, respectively. Within the retiming stage 71, the sliced data signal 28 is coupled to the data inputs (D) of the first and second retiming stage latches 72, 74. The recovered clock signal 36 is coupled to the clock input of the first retiming stage latch (D1) 72, and the logical inversion of the recovered clock signal 36 is coupled to the clock input of the second retiming stage latch (D2) 74. The first retiming stage latch (D1) 72 samples the sliced data signal 28 at the rising edges of the recovered clock signal 36 to generate the retimed data signal 30, and the second retiming stage latch (D2) 74 samples the sliced data signal 28 at the falling edges of the recovered clock signal 36 to generate the synchronization signal (P1) 80.

The phase synchronization stage 75 is coupled to the retimed data signal 30 and the synchronization signal (P1) 80, and samples the synchronization signal (P1) 80 on the rising edge and falling edges of the retimed data signal 30 to generate the rising edge output signal 32 and the falling edge output signal 34, respectively. Within the phase synchronization stage 75, the synchronization signal (P1) 80 is coupled to the data inputs (D) of the first and second synchronization stage latches 76, 78. The retimed data signal 30 is coupled to the clock input of the first synchronization stage latch (D3) 76, and the logical inversion of the retimed data signal 30 is coupled to the clock input of the second synchronization stage latch (D4) 78. The first synchronization stage latch (D3) 76 samples the synchronization signal (P1) 80 at the rising edges of the retimed data signal 30 to generate the rising edge output signal 32, and the second synchronization stage latch (D4) 78 samples the synchronization signal (P1) 80 at the falling edges of the retimed data signal 30 to generate the falling edge output signal 34.

Figure 7:
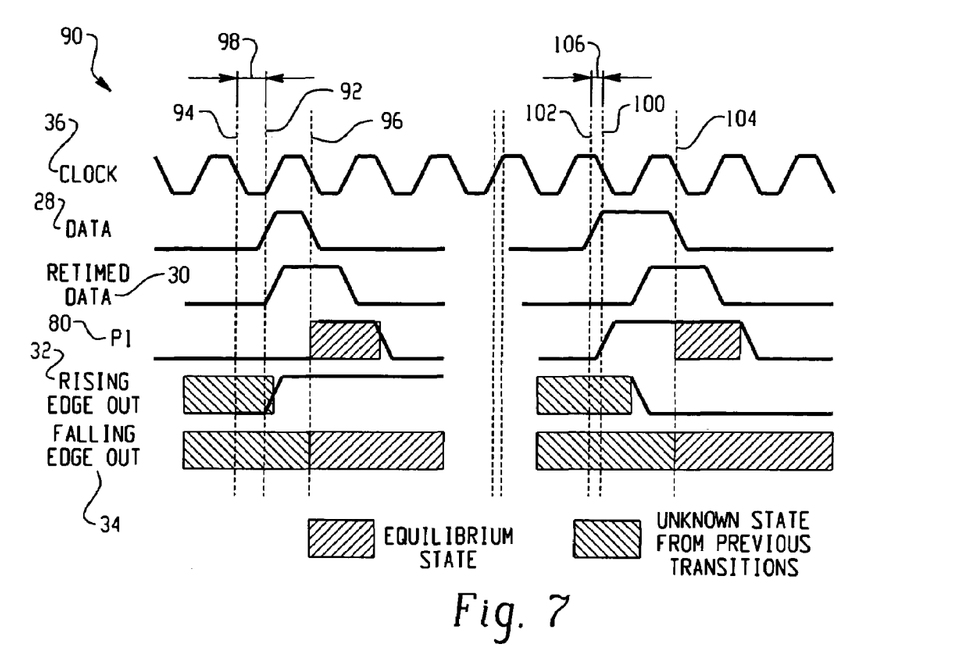
FIGS. 7 and 8 are timing diagrams illustrating an example operation of the phase detector circuit of FIG. 6.
Figure 8:
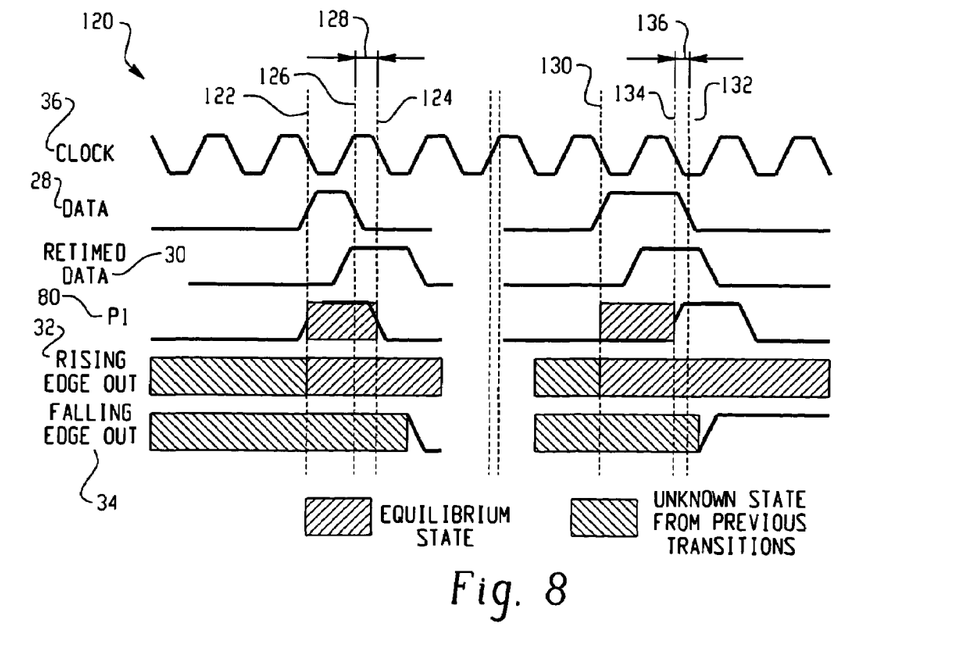

FIGS. 7 and 8 are timing diagrams illustrating an example operation of the phase detector circuit 70 of FIG. 6. FIG. 7 illustrates an example operation of the phase detector circuit 70 in a clock and data recovery circuit 10, as illustrated in FIG. 3, in which a rising edge 92, 102 of the sliced data signal 28 is out of phase with the falling clock edge 94, 100 due to duty cycle distortion in the data signal 28. FIG. 8 illustrates an example operation of the phase detector circuit 70 in a clock and data recovery circuit 50, as illustrated in FIG. 4, in which a falling edge 126, 132 of the sliced data signal 28 is out of phase with the falling clock edge 124, 134 due to duty cycle distortion in the data signal 28.

An example operation of the system 10 of FIG. 3 is further illustrated by FIGS. 7 and 8, which are applicable to the phase detector shown in FIG. 6. The falling edge of the recovered clock signal 36 generated by the clock and data recovery system 10 aligns to the falling edges of the sliced input data signal 28. The rising edge of the sliced input data signal 28 is used to detect the duty cycle distortion through a comparison with the phase of the recovered clock signal 36. FIG. 8 illustrates how the first feedback circuit 20, 22 may achieve phase lock in the system 10. The falling edge output signal 34 is used to determine the phase relationship between the falling data edges and the falling edge of the recovered clock signal 36. On the left side of FIG. 8, the falling edge output signal 34 indicated that the clock is late with respect to the falling edge of the sliced data signal 28. On the right side of FIG. 8, the falling edge output signal 34 indicates that the clock 36 is early with respect to the falling edge 126 of the sliced data signal 28. By applying the appropriate polarity in the first feedback circuit 20, 22, the falling edges of the sliced data signal 28 may be aligned to the falling edge of the recovered clock signal 36.

FIG. 7 demonstrates a condition in which the falling clock edges are aligned to the falling data edges 96, 104. The falling edge output signal 34 has reached the equilibrium state, toggling between logic high and logic low states to keep the system 10 phase locked. The second feedback circuit 24 uses information from the rising edge output signal 32 to cancel out the duty cycle distortion illustrated in FIG. 7. The left-hand side of the illustration 90 shows an example where the width of the high bit in the sliced data signal 28 is smaller than ideal, causing the rising edge 92 of the sliced data signal 28 to lag the falling edge 94 of the recovered clock signal 36. The resultant phase difference 98 between the sliced data signal 28 and the recovered clock signal 36 causes the phase detector circuit 70 to generate a high logic state on the rising edge output signal 32. The right-hand side of FIG. 7 shows an example where the width of the high bit in the sliced data signal 28 is larger than ideal, causing the rising edge 102 of the sliced data signal 28 to lead the falling edge 100 of the recovered clock signal 36. The resultant phase difference 106 between the recovered clock signal 36 and the sliced data signal 28 causes the phase detector circuit 70 to generate a low logic state on the rising edge output signal 32. In this manner, the phase detector circuit 70, used in the clock and data recovery circuit 10, may detect if the high bit is too thin or too wide using the rising edge output signal 32. Using the appropriate polarity in the second feedback loop, the duty cycle distortion in the input data signal 26 can be corrected.

The falling edge output signal 34 illustrated in FIG. 7 constantly changes between a high logic state and a low logic state because it is phase-locked with the recovered clock signal 36, as described above with reference to FIG. 3. Thus, the first feedback circuit 20, 22 forces the recovered clock signal 36 to phase-align with the falling data edges 96, 104.

With reference to FIG. 8, the left-hand side of the illustration 120 shows an example wherein the width of the high bit in the sliced data signal 28 is less than ideal, causing the falling edge 126 of the sliced data signal 28 to lead the falling edge 124 of the recovered clock signal 36. The resultant phase difference 128 between the recovered clock signal 36 and the sliced data signal 28 causes the phase detector circuit 70 to generate a low logic state on the falling edge output signal 34. The right-hand side of FIG. 8 shows an example where the width of the high bit in the sliced data signal 28 is larger than ideal, causing the falling edge 132 of the sliced data signal 28 to lag the falling edge 134 of the recovered clock signal 36. The resultant phase difference 136 between the sliced data signal 28 and the recovered clock signal 36 causes the phase detector circuit 70 to generate a high logic state on the falling edge output signal 34. The rising edge output signal 32 illustrated in FIG. 8 constantly changes between a high logic state and a low logic state because it is phase-locked with the recovered clock signal 36, as described above with reference to FIG. 4. Thus, the first feedback circuit 20, 22 forces the recovered clock signal 36 to phase-align with the rising data edges 122, 130.

Figure 9:
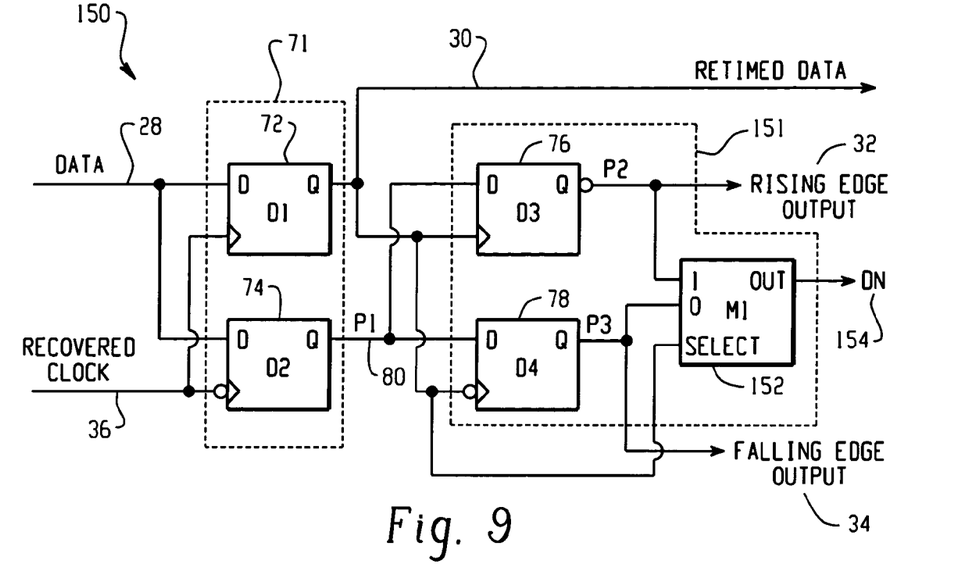
FIG. 9 is a block diagram of an example phase detector circuit for the clock and data recovery system of FIG. 5.

FIG. 9 is a block diagram of an example of one alternative phase detector circuit 150 for the clock and data recovery system 60 of FIG. 5. This circuit 150 is similar to the example phase detector circuit 70 shown in FIG. 6, except that the phase synchronization stage 151 includes a multiplexer 152. As noted above with reference to FIG. 5, the rising edge output signal 32 and the falling edge output signal 34 may be fed-back to a two-input charge pump filter 20, 24 in the first and/or second feedback circuits, or may alternatively be combined into a single feedback signal (DN) 154 which is input to the charge pump filter(s) 20, 24 in the first and/or second feedback circuits. The multiplexer 152 shown in FIG. 9 provides one example circuit for combining the rising edge output signal 32 with the falling edge output signal 34.

More specifically, the phase synchronization stage 151 is coupled to the retimed data signal 30 and the synchronization signal (P1) 80, and samples the synchronization signal (P1) 80 on the rising and falling edges of the retimed data signal 30 to generate the rising edge output signal (P2) 32 and the falling edge output signal (P3) 34, as described above with reference to FIG. 6. The rising and falling edge output signals 32, 34 are coupled as data inputs (1, 0) of the multiplexer (M1) 152, and the retimed data signal 30 is fed forward as a select input to the multiplexer (M1) 152. When the multiplexer (M1) 152 detects the rising edge of the retimed data signal 30 at its select input, the rising edge output signal (P2) 32 is selected as the feedback signal (DN) 154. Similarly, when the falling edge of the retimed data signal 30 is detected at the select input of the multiplexer (M1) 152, the falling edge output signal 34 is selected as the feedback signal (DN) 154.

Figure 10:
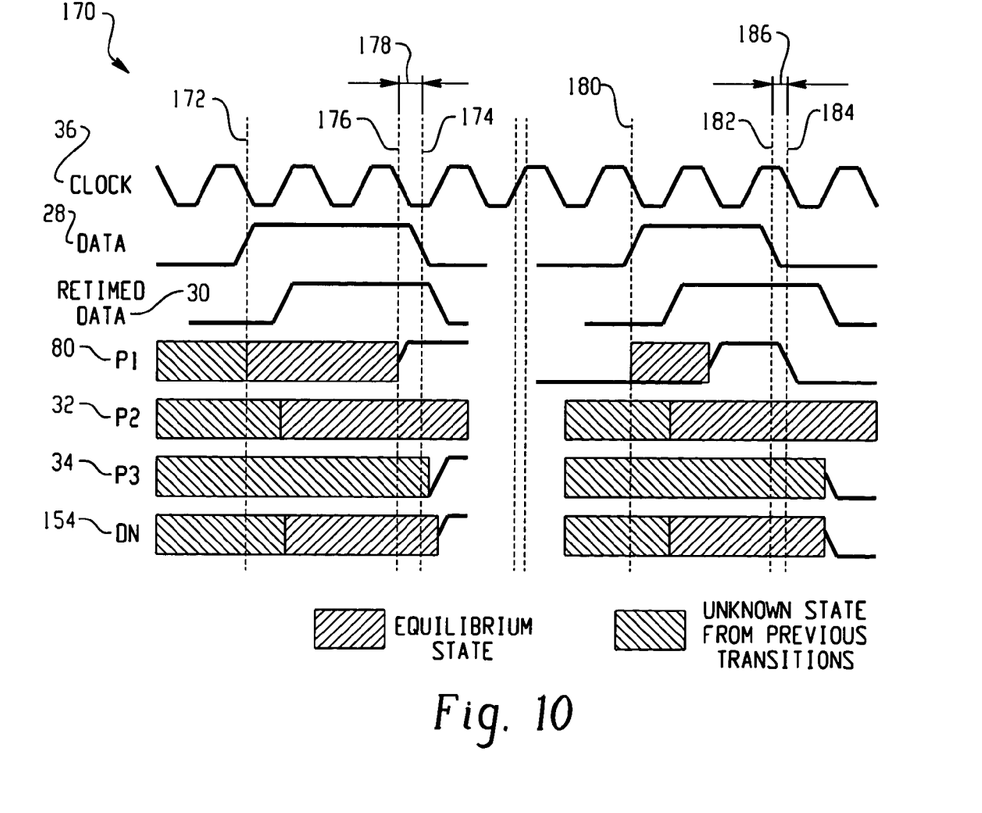
FIGS. 10 and 11 are timing diagrams illustrating an example operation of the phase detector circuit of FIG. 9.
Figure 11:
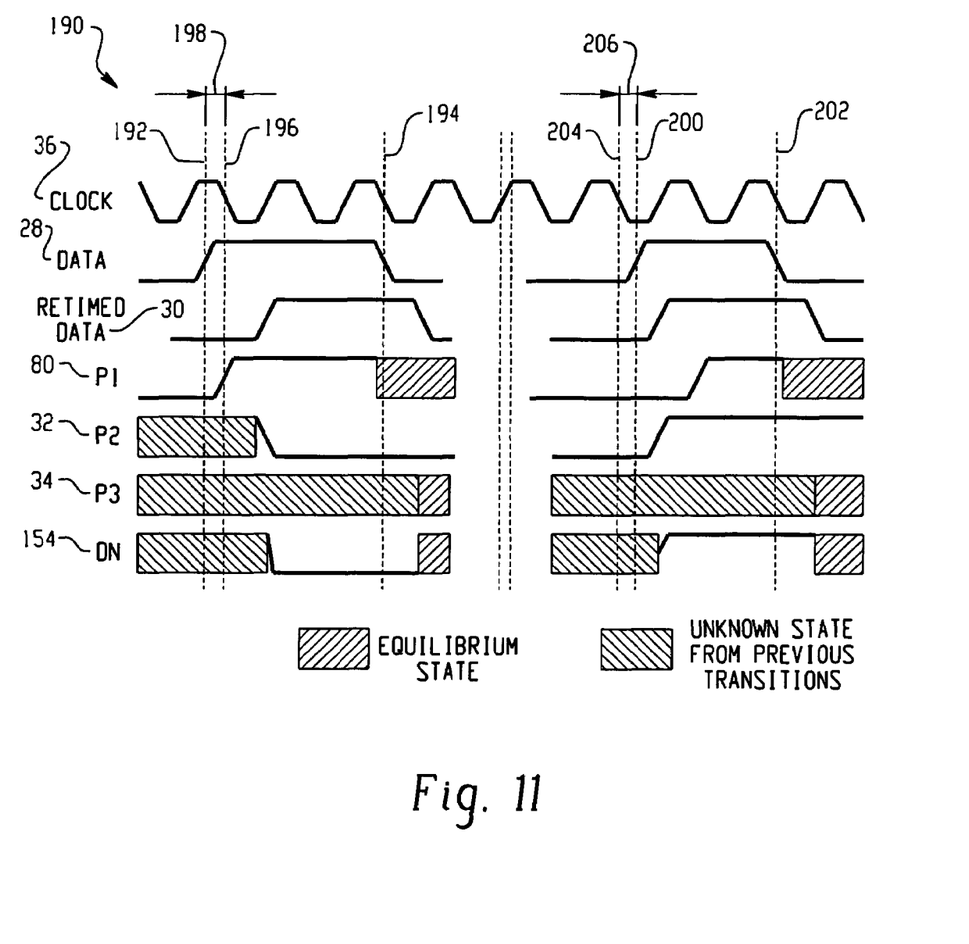

FIGS. 10 and 11 are timing diagrams 170, 190 illustrating an example operation of the phase detector circuit 150 of FIG. 9. FIG. 10 illustrates examples in which a falling edge 174, 182 of the sliced data signal 28 is out of phase with the falling edge 176, 184 of the recovered clock signal 36. FIG. 11 illustrates examples in which a rising edge 192, 200 of the sliced data signal 28 is out of phase with the falling edge 196, 204 of the recovered clock signal 36.

With reference to FIG. 10, the left-hand side of the illustration 170 shows an example where the width of the high bits in the sliced data signal 28 are larger than ideal, causing the falling edge 174 of the sliced data signal 28 to lag the falling edge 176 of the recovered clock signal 36. The resultant phase difference 178 between the recovered clock signal 36 and the sliced data signal 28 causes the phase detector circuit 150 to generate a high logic level on the falling edge output signal (P3) 34 and the feedback signal (DN) 154. The right-hand side of FIG. 10 shows an example where the width of the high bits in the sliced data signal 28 are smaller than ideal, causing a falling edge 182 of the sliced data signal 28 to lead the falling edge 184 of the recovered clock signal 36. The resultant phase difference 186 between the sliced data signal 28 and the recovered clock signal 36 causes the phase detector circuit 150 to generate a low logic level on the falling edge output signal (P3) 34 and the feedback signal (DN) 154.

With reference to FIG. 11, the left-hand side of the illustration 190 shows an example where the width of the high bits in the sliced data signal 28 are larger than ideal, causing the rising edge 192 of the sliced data signal 28 to lead the falling edge 196 of the recovered clock signal 36. The resultant phase difference 198 between the recovered clock signal 36 and the sliced data signal 28 causes the phase detector circuit 150 to generate a low logic level on the rising edge output signal (P2) 32 and the feedback signal (DN) 154. The right-hand side of FIG. 11 shows an example where the width of the high bits in the sliced data signal 28 are smaller than ideal, causing the rising edge 200 of the sliced data signal 28 to lag the falling edge 204 of the recovered clock signal 36. The resultant phase difference 206 between the sliced data signal 28 and the recovered clock signal 36 causes the phase detector circuit 150 to generate a high logic level on the rising edge output signal (P2) 32 and the feedback signal (DN) 154.

This written description uses examples to disclose the invention, including the best mode, and also to enable a person skilled in the art to make and use the invention. The patentable scope of the invention may include other examples that occur to those skilled in the art. For example, in alternative embodiments, the clock and data recovery circuits illustrated in FIGS. 3-5 may include separate phase detector circuits for the first and second feedback circuits. In another alternative embodiment, the rising and falling edge output signals 32, 34 illustrated in FIGS. 3-5 may be combined by the phase detector circuit 14, 16, 18 to generate one or more combined feedback signal(s) input to the first and/or second feedback circuit.

It is claimed:

1. A system for automatically correcting duty cycle distortion in a data input signal, comprising:
    a slicer operable to receive the data input signal and compare the data input signal with a slicer offset voltage to generate a sliced data signal, the slicer being further operable to receive an offset control signal to automatically adjust the slicer offset voltage;
    a phase detector circuit operable to receive the sliced data signal and a recovered clock signal and to compare the sliced data signal with the recovered clock signal to generate a rising edge output signal and a falling edge output signal, the rising edge output signal corresponding to a phase difference between a rising edge of the sliced data signal and an edge of the recovered clock signal, the falling edge output signal corresponding to a phase difference between a falling edge of the sliced data signal and an edge of the recovered clock signal;
    a first feedback circuit operable to phase-lock the recovered clock signal to the sliced data signal utilizing at least one of the rising edge output signal and the falling edge output signal; and
    at least one of the rising edge output signal and the falling edge output signal being configured in a second feedback circuit to generate the offset control signal;
    wherein the first feedback circuit is operable to phase-lock the recovered clock signal to the sliced data signal utilizing both the rising edge output signal and the falling edge output signal.

2. The system of claim 1, wherein the first feedback circuit is a phase-locked loop circuit.

3. The system of claim 2, wherein the phase-locked loop circuit comprises:
    a charge pump filter that receives at least one of the rising edge output signal and the falling edge output signal and generates a charge pump output signal with a polarity corresponding to at least one of the rising edge output signal and the falling edge output signal; and
    a voltage-controlled oscillator that generates the recovered clock signal with a frequency that is a function of the charge pump output signal.

4. The system of claim 3, wherein the charge pump is a two-input charge pump.

5. The system of claim 2, wherein the phase detector circuit generates a feedback signal selected from the rising edge output signal and the falling edge output signal, and wherein the phase-locked loop circuit comprises:
    a charge pump filter that receives the feedback signal and generates a charge pump output signal with a polarity corresponding to the feedback signal; and
    a voltage-controlled oscillator that generates the recovered clock signal with a frequency that is a function of the charge pump output signal.

6. The system of claim 1, wherein the first feedback circuit is a delay-locked loop circuit.

7. The system of claim 6, wherein the first feedback circuit comprises:
    a charge pump filter that receives at least one of the rising edge output signal and the falling edge output signal and generates a charge pump output signal with a polarity corresponding to at least one of the rising edge output signal and the falling edge output signal;
    a fixed frequency signal generator that generates a reference clock signal; and
    means for controlling the phase of the reference clock signal as a function of the charge pump output signal to generate the recovered clock signal.

8. The system of claim 7, wherein the controlling means is a phase interpolator coupled to the charge pump output signal and the reference clock signal and operable to control the phase of the reference clock signal as a function of the charge pump output signal to generate the recovered clock signal.

9. The system of claim 7, wherein the controlling means is a voltage controlled delay circuit coupled to the charge pump output signal and the reference clock signal and operable to control the phase of the reference clock signal as a function of the charge pump output signal to generate the recovered clock signal.

10. The system of claim 7, wherein the controlling means is a current controlled delay circuit coupled to the charge pump output signal and the reference clock signal and operable to control the phase of the reference clock signal as a function of the charge pump output signal to generate the recovered clock signal.

11. The system of claim 6, wherein the phase detector circuit generates a feedback signal selected from the rising edge output signal and the falling edge output signal, and wherein the first feedback circuit comprises:

a charge pump filter that receives the feedback signal and generates a charge pump output signal with a polarity corresponding to the feedback signal;

a fixed frequency signal generator that generates a reference clock signal; and means for controlling the phase of the reference clock signal as a function of the charge pump output signal to generate the recovered clock signal.

12. The system of claim 11, wherein the controlling means is a phase interpolator coupled to the charge pump output signal and the reference clock signal and operable to control the phase of the reference clock signal as a function of the charge pump output signal to generate the recovered clock signal.

13. The system of claim 11, wherein the controlling means is a voltage controlled delay circuit coupled to the charge pump output signal and the reference clock signal and operable to control the phase of the reference clock signal as a function of the charge pump output signal to generate the recovered clock signal.

14. The system of claim 11, wherein the controlling means is a current controlled delay circuit coupled to the charge pump output signal and the reference clock signal and operable to control the phase of the reference clock signal as a function of the charge pump output signal to generate the recovered clock signal.

15. The system of claim 1, wherein the phase detector circuit synchronizes the sliced data signal with the recovered clock signal to generate a retimed data signal.

16. The system of claim 15, wherein the phase detector circuit comprises:

a retiming stage coupled to the sliced data signal and the recovered clock signal, wherein the retiming stage is triggered by the recovered clock signal and samples the sliced data signal to generated the retimed data signal and a synchronization signal; and a synchronization stage coupled to the synchronization signal and the retimed data signal, wherein the synchronization stage is triggered by the retimed data signal and samples the synchronization signal to generate the rising edge output signal and the falling edge output signal.

17. The system of claim 16, wherein the retiming stage of the phase detector circuit comprises:

a first retiming stage latch coupled to the sliced data signal and the recovered clock signal that samples the sliced data signal on a rising edge of the recovered clock signal to generate the retimed data signal; and a second retiming stage latch coupled to the sliced data signal and the recovered clock signal that samples the sliced data signal on the falling edge of the recovered clock signal to generate the synchronization signal.

18. The system of claim 16, wherein the synchronization stage of the phase detector circuit comprises:

a first synchronization stage latch coupled to the retimed data signal and the synchronization signal that samples the synchronization signal on the rising edge of the retimed data signal to generate the rising edge output signal; and a second synchronization stage latch coupled to the retimed data signal and the synchronization signal that samples the synchronization signal on the falling edge of the retimed data signal to generate the falling edge output signal.

19. The system of claim 16, wherein the phase detector circuit generates a feedback signal selected from the rising edge output signal and the falling edge output signal and the first feedback circuit is operable to phase-lock the recovered clock signal to the sliced data signal utilizing the feedback signal, and wherein the synchronization stage of the phase detector circuit comprises:

a first synchronization stage latch coupled to the retimed data signal and the synchronization signal that samples the synchronization signal on the rising edge of the retimed data signal to generate the rising edge output signal;

a second synchronization stage latch coupled to the recovered clock signal and the synchronization signal that samples the synchronization signal on the falling edge of the recovered clock signal to generate the falling edge output signal; and a multiplexer having a first data input coupled to the rising edge output signal, a second data input coupled to the falling edge output signal and a select input coupled to the retimed data signal, wherein the select input controls whether the multiplexer selects the rising edge output signal or the falling edge output signal to generate the feedback signal.

20. The system of claim 16, wherein the phase detector circuit generates a feedback signal selected from the rising edge output signal and the falling edge output signal and the feedback signal is configured in the second feedback circuit to generate the offset control signal, and wherein the synchronization stage of the phase detector circuit comprises:

a first synchronization stage latch coupled to the retimed data signal and the synchronization signal that samples the synchronization signal on the rising edge of the retimed data signal to generate the rising edge output signal;

a second synchronization stage latch coupled to the retimed data signal and the synchronization signal that samples the synchronization signal on the falling edge of the retimed data signal to generate the falling edge output signal; and a multiplexer having a first data input coupled to the rising edge output signal, a second data input coupled to a logical inversion of the falling edge output signal and a select input coupled to the retimed data signal, wherein the select input controls whether the multiplexer selects the rising edge output signal or the falling edge output signal to generate the feedback signal.

21. A system for automatically correcting duty cycle distortion in a data input signal, comprising:

a slicer operable to receive the data input signal and compare the data input signal with a slicer offset voltage to generate a sliced data signal, the slicer being further operable to receive an offset control signal to automatically adjust the slicer offset voltage;

a phase detector circuit operable to receive the sliced data signal and a recovered clock signal and to compare the sliced data signal with the recovered clock signal to generate a rising edge output signal and a falling edge output signal, the rising edge output signal corresponding to a phase difference between a rising edge of the sliced data signal and an edge of the recovered clock signal, the falling edge output signal corresponding to a phase difference between a falling edge of the sliced data signal and an edge of the recovered clock signal;

a first feedback circuit operable to phase-lock the recovered clock signal to the sliced data signal utilizing at least one of the rising edge output signal and the falling edge output signal; and at least one of the rising edge output signal and the falling edge output signal being configured in a second feedback circuit to generate the offset control signal;

wherein the phase detector circuit generates a feedback signal selected from the rising edge output signal and the falling edge output signal, and wherein the feedback signal is configured in the second feedback circuit to generate the offset control signal.

22. The system of claim 21, wherein the second feedback circuit includes a charge pump filter that receives the feedback signal and generates the offset control signal with a polarity corresponding to the feedback signal.

23. A system for automatically correcting duty cycle distortion in a data input signal, comprising:

a slicer operable to receive the data input signal and compare the data input signal with a slicer offset voltage to generate a sliced data signal, the slicer being further operable to receive an offset control signal to automatically adjust the slicer offset voltage;

a phase detector circuit operable to receive the sliced data signal and a recovered clock signal and to compare the sliced data signal with the recovered clock signal to generate a rising edge output signal and a falling edge output signal, the rising edge output signal corresponding to a phase difference between a rising edge of the sliced data signal and an edge of the recovered clock signal, the falling edge output signal corresponding to a phase difference between a falling edge of the sliced data signal and an edge of the recovered clock signal;

a first feedback circuit operable to phase-lock the recovered clock signal to the sliced data signal utilizing at least one of the rising edge output signal and the falling edge output signal; and at least one of the rising edge output signal and the falling edge output signal being configured in a second feedback circuit to generate the offset control signal;

wherein both the rising edge output signal and the falling edge output signal are configured in the second feedback circuit.

24. The system of claim 23, wherein the second feedback circuit includes a two-input charge pump filter that receives the rising edge output signal and the falling edge output signal and generates the offset control signal.

25. The system of claim 23, wherein the second feedback circuit compares the rising edge output signal and the falling edge output signal to generate a combined feedback signal and generates the offset control signal as a function of the combined feedback signal.

26. The system of claim 25, wherein the second feedback circuit includes a charge pump filter that receives the combined feedback signal and generates the offset control signal with a polarity corresponding to the combined feedback signal.

27. A system for automatically correcting duty cycle distortion in a data input signal, comprising:

a slicer operable to receive the data input signal and compare the data input signal with a slicer offset voltage to generate a sliced data signal, the slicer being further operable to receive an offset control signal to automatically adjust the slicer offset voltage;

a phase detector circuit operable to receive the sliced data signal and a recovered clock signal and to compare the sliced data signal with the recovered clock signal to generate a rising edge output signal and a falling edge output signal, the rising edge output signal corresponding to a phase difference between a rising edge of the sliced data signal and an edge of the recovered clock signal, the falling edge output signal corresponding to a phase difference between a falling edge of the sliced data signal and an edge of the recovered clock signal;

a first feedback circuit operable to phase-lock the recovered clock signal to the sliced data signal utilizing at least one of the rising edge output signal and the falling edge output signal; and at least one of the rising edge output signal and the falling edge output signal being configured in a second feedback circuit to generate the offset control signal;

wherein the phase detector circuit generates a feedback signal selected from the rising edge output signal and the falling edge output signal, and wherein the first feedback circuit is operable to phase-lock the recovered clock signal to the sliced data signal utilizing the feedback signal.

28. A system for automatically correcting duty cycle distortion in a data input signal, comprising:

a slicer operable to receive the data input signal and compare the data input signal with a slicer offset voltage to generate a sliced data signal, the slicer being further operable to receive an offset control signal to automatically adjust the slicer offset voltage;

a phase detector circuit operable to receive the sliced data signal and a recovered clock signal and to compare the sliced data signal with the recovered clock signal to generate a rising edge output signal and a falling edge output signal, the rising edge output signal corresponding to a phase difference between a rising edge of the sliced data signal and an edge of the recovered clock signal, the falling edge output signal corresponding to a phase difference between a falling edge of the sliced data signal and an edge of the recovered clock signal;

a first feedback circuit operable to phase-lock the recovered clock signal to the sliced data signal utilizing at least one of the rising edge output signal and the falling edge output signal; and at least one of the rising edge output signal and the falling edge output signal being configured in a second feedback circuit to generate the offset control signal;

wherein the second feedback circuit includes a charge pump filter that receives at least one of the rising edge output signal and the falling edge output signal and generates the offset control signal with a polarity corresponding to at least one of the rising edge output signal and the falling edge output signal.

* * * * *